(12) United States Patent
Park et al.

(10) Patent No.: US 8,198,802 B2
(45) Date of Patent: Jun. 12, 2012

(54) ORGANIC LIGHT EMITTING DIODE DISPLAY FOR SUPPRESSING REFLECTION OF EXTERNAL LIGHT

(75) Inventors: Soon-Ryong Park, Yongin-si (KR);
Hee-Seong Jeong, Yongin-si (KR);
Woo-Suk Jung, Yongin-si (KR);
Noh-Min Kwak, Yongin-si (KR);
Chul-Woo Jeong, Yongin-si (KR);
Eun-Ah Kim, Yongin-si (KR);
Hee-Chul Jeon, Yongin-si (KR);
Joo-Hwa Lee, Yongin-si (KR)

(73) Assignee: Samsung Mobile Display Co., Ltd., Yongin-si, Gyeonggi-do (KR)

( * ) Notice: Subject to any disclaimer, the term of this patent is extended or adjusted under 35 U.S.C. 154(b) by 190 days.

(21) Appl. No.: 12/508,409

(22) Filed: Jul. 23, 2009

(65) Prior Publication Data
US 2010/0019666 A1   Jan. 28, 2010

Related U.S. Application Data

(60) Provisional application No. 61/083,863, filed on Jul. 25, 2008.

(30) Foreign Application Priority Data

Feb. 5, 2009 (KR) .................... 10-2009-0009362

(51) Int. Cl.
*H01J 1/63* (2006.01)
(52) U.S. Cl. ........ 313/504; 313/506; 313/507; 313/508; 349/115

(58) Field of Classification Search .......... 313/498–512; 428/690–691, 917; 438/26–29, 34, 82; 257/40, 257/72, 98–100, 642–643, 759; 427/66, 427/532–535, 539
See application file for complete search history.

(56) References Cited

U.S. PATENT DOCUMENTS
| | | | |
|---|---|---|---|
| 6,118,504 | A | 9/2000 | Iijima et al. |
| 6,169,708 | B1 | 1/2001 | Kaneko et al. |
| 6,297,864 | B1 | 10/2001 | Kaneko et al. |

(Continued)

FOREIGN PATENT DOCUMENTS
EP      0588504 A1    3/1994
(Continued)

OTHER PUBLICATIONS

European search report for European patent application No. 09166447.4-2203 dated Nov. 24, 2009 by European Patent Office.

(Continued)

*Primary Examiner* — Tracie Y Green
(74) *Attorney, Agent, or Firm* — Knobbe, Martens, Olson & Bear LLP

(57) ABSTRACT

An organic light emitting diode (OLED) display is disclosed. In one embodiment, the OLED display includes i) an OLED comprising i) a first electrode, ii) an organic emission layer formed on the first electrode, and iii) a second electrode formed on the organic emission layer, ii) a dual brightness enhancement film (DBEF) formed over the second electrode of the OLED, iii) a first polarizing plate formed on the DBEF, iv) a cholesteric liquid crystal (CLC) layer formed on the first polarizing plate, v) a phase delay plate that is a ¼ wavelength plate formed on the CLC layer and vi) a second polarizing plate formed on the phase delay plate.

20 Claims, 3 Drawing Sheets

U.S. PATENT DOCUMENTS

| | | | |
|---|---|---|---|
| 6,624,936 | B2 | 9/2003 | Kotchick et al. |
| 6,774,962 | B2 | 8/2004 | Yoon |
| 6,787,976 | B2 | 9/2004 | Minoura et al. |
| 6,841,803 | B2 | 1/2005 | Aizawa et al. |
| 6,898,018 | B2 | 5/2005 | Minoura et al. |
| 2002/0043931 | A1 | 4/2002 | Minoura et al. |
| 2002/0122235 | A1 | 9/2002 | Kurtz et al. |
| 2003/0127656 | A1 | 7/2003 | Aizawa et al. |
| 2004/0051445 | A1 | 3/2004 | Adachi |
| 2004/0189167 | A1* | 9/2004 | Adachi et al. ............... 313/112 |
| 2006/0145600 | A1* | 7/2006 | Yu et al. ............... 313/504 |
| 2006/0187384 | A1 | 8/2006 | Hisatake |
| 2007/0024777 | A1 | 2/2007 | Sawayama et al. |
| 2007/0085476 | A1 | 4/2007 | Hirakata et al. |
| 2007/0145889 | A1* | 6/2007 | Tamura et al. ............... 313/504 |
| 2007/0230211 | A1 | 10/2007 | Osato et al. |
| 2008/0123321 | A1 | 5/2008 | Hsu et al. |
| 2008/0144177 | A1 | 6/2008 | Miller |
| 2009/0290079 | A1 | 11/2009 | Evans et al. |

FOREIGN PATENT DOCUMENTS

| | | |
|---|---|---|
| EP | 0969296 A2 | 1/2000 |
| GB | 2437553 A | 10/2007 |
| JP | 06-109925 A | 4/1994 |
| JP | 06-235914 | 8/1994 |
| JP | 07-205322 A | 8/1995 |
| JP | 2001-357979 | 12/2001 |
| JP | 2002-198184 | 7/2002 |
| JP | 2003-121835 | 4/2003 |
| JP | 2003-186413 | 7/2003 |
| JP | 2003-186413 A | 7/2003 |
| JP | 2003-279988 | 10/2003 |
| JP | 2003-315548 A | 11/2003 |
| JP | 2004-030955 A | 1/2004 |
| JP | 2004-070094 A | 3/2004 |
| JP | 2004-086145 | 3/2004 |
| JP | 2004-219825 A | 8/2004 |
| JP | 2004-296162 | 10/2004 |
| JP | 2004-296162 A | 10/2004 |
| JP | 2004-361774 A | 12/2004 |
| JP | 2005-108540 | 4/2005 |
| JP | 2006-343553 | 12/2006 |
| JP | 2006-343553 A | 12/2006 |
| JP | 2007-041536 A | 2/2007 |
| JP | 2007-141824 A | 6/2007 |
| KR | 10-2002-0003428 A | 1/2002 |
| KR | 2003-0038037 | 5/2003 |
| KR | 10-2003-0077402 A | 10/2003 |
| KR | 10-0454748 | 10/2004 |
| KR | 10-2005-0018401 A | 2/2005 |
| KR | 10-2005-0020332 A | 3/2005 |
| KR | 10-2005-0026863 A | 3/2005 |
| KR | 10-2005-0071387 A | 7/2005 |
| KR | 10-2005-0106004 A | 11/2005 |
| KR | 10-2006-0065729 A | 6/2006 |
| KR | 10-0606778 | 8/2006 |
| KR | 10-0706730 | 4/2007 |
| KR | 10-0714015 | 4/2007 |
| KR | 10-2007-0095826 A | 10/2007 |
| KR | 10-2008-0061791 A | 7/2008 |
| KR | 10-2008-0076384 A | 8/2008 |

OTHER PUBLICATIONS

European search report for European patent application No. 09166444.1-1235 dated Nov. 23, 2009 by European Patent Office.

The Extended European Search Report for European patent application No. 09168087.6-2203 dated Dec. 2, 2009 by European Patent Office.

Office Action dated Mar. 22, 2011 in related U.S. Appl. No. 12/508,426, filed Jul. 23, 2009.

Japanese Notice of Allowance dated Jan. 24, 2012 for Japanese Patent Application No. JP 2009-097936 which shares priority of Korean Patent Application No. KR 10-2009-0009364 with U.S. Appl. No. 12/508,438, filed Jul. 23, 2009, which is related to captioned U.S. Appl. No. 12/508,409.

* cited by examiner

ORGANIC LIGHT EMITTING DIODE DISPLAY FOR SUPPRESSING REFLECTION OF EXTERNAL LIGHT

CROSS-REFERENCES TO RELATED APPLICATIONS

This application claims priority to and the benefit of U.S. Provisonal Application No. 61/083,863 filed on Jul. 25, 2008 and Korean Patent Application No. 10-2009-0009362 filed on Feb. 5, 2009, the entire contents of which are incorporated herein by reference.

This application relates to 1) U.S. patent application entitled "ORGANIC LIGHT EMITTING DIODE DISPLAY" and 2) U.S. patent application entitled "ORGANIC LIGHT EMITTING DIODE DISPLAY", which are concurrently filed as this application and incorporated herein by reference in their entirety.

BACKGROUND OF THE INVENTION

1. Field of the Invention

The present invention relates to an organic light emitting diode (OLED) display. More particularly, it relates to an OLED display having improved display characteristics.

2. Description of the Related Technology

An organic light emitting diode (OLED) display includes a plurality of OLEDs each having a hole injection electrode, an organic emission layer, and an electron injection electrode. When the anode and cathode inject holes and electrons into the organic light emitting layer, the OLEDs emit light using energy generated when excitons generated by electron-hole combinations in the organic light emitting layer are dropped from an excited state to a ground state, and an image is displayed when the excitons are dropped from an excited state to a ground state.

Therefore, the OLED display has self-luminance characteristics and the thickness and weight of the OLED display can be reduced since it does not require a separate light source, unlike a liquid crystal display (LCD).

In addition, since the OLED display exhibits high-quality characteristics such as low power consumption, high luminance, high response speed, etc., it is receiving much attention as a next-generation display device.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

One aspect of the present invention is an OLED display that can suppress reflection of external light while minimizing loss of light generated from an organic emission layer.

Another aspect of the present invention is an OLED having a first electrode, an organic emission layer formed on the first electrode, a second electrode formed on the organic emission layer, a dual brightness enhancement film (DBEF) formed on the second electrode of the OLED, a first polarizing plate formed on the DBEF, a cholesteric liquid crystal (CLC) layer formed on the first polarizing plate, a phase delay plate that is a ¼ wavelength plate formed on the CLC layer, and a second polarizing plate formed on the phase delay plate.

A polarizing axis of the first polarizing plate and a polarizing axis of the second polarizing plate may cross each other.

The polarizing axis of the first polarizing plate and a polarizing axis of the DBEF may be the same.

The CLC layer may transmit one of right-circularly polarized light and left-circularly polarized light, and may reflect the other one.

Light that is linearly polarized through the second polarizing plate may be circularly polarized while passing through the phase delay plate.

The light that is circularly polarized through the phase delay plate may pass through the CLC layer.

Linearly polarized light having a polarizing axis in a direction that is the same as a light axis of the CLC layer may be circularly polarized while passing through the CLC layer.

The polarizing axis of the first polarizing axis and the light axis of the CLC layer may be the same.

The light that is linearly polarized through the first polarizing plate may be circularly polarized while passing through the phase delay plate, and the light that is circularly polarized through the CLC layer may be changed to linearly polarized light having an axis direction that is the same as the polarizing axis of the second polarizing late while passing through the CLC layer.

The OLED display may further include an additional phase delay plate disposed between the OLED and the DBEF.

The additional phase delay plate may be a ¼ wavelength plate, and may change linearly polarizing light through the DBEF to circularly polarized light.

Another aspect of the invention is an organic light emitting diode (OLED) display comprising: an OLED comprising i) a first electrode, ii) an organic emission layer formed on the first electrode, and iii) a second electrode formed on the organic emission layer; a dual brightness enhancement film (DBEF) formed over the second electrode of the OLED; a first polarizing plate formed on the DBEF; a cholesteric liquid crystal (CLC) layer formed on the first polarizing plate; a phase delay plate formed on the CLC layer, wherein the phase delay plate is a ¼ wavelength plate; and a second polarizing plate formed on the phase delay plate.

In the above display, the CLC layer is configured to transmit one of right-circularly polarized light and left-circularly polarized light and reflect the other light. In the above display, the phase delay plate is configured to receive first linearly polarized light from the second polarizing plate and output first circularly polarized light toward the CLC layer. In the above display, wherein the CLC layer is configured to transmit the first circularly polarized light toward the first polarizing plate.

In the above display, the first polarizing plate is configured to i) transmit a portion of the first circularly polarized light which matches a polarizing axis of the first polarizing plate and ii) absorb a portion of the first circularly polarized light which does not match the polarizing axis of the first polarizing plate. In the above display, the DBEF is configured to receive and transmit, the portion of the first circularly polarized light which matches a polarizing axis of the first polarizing plate, toward the OLED.

In the above display, the CLC layer is configured to receive second linearly polarized light from the first polarizing plate and output second circularly polarized light toward the phase delay plate. In the above display, the additional phase delay plate is a ¼ wavelength plate, and wherein the additional phase plate is configured to change linearly polarizing light received from the DBEF to circularly polarized light. The above display further comprises an adhesive layer between the OLED and the additional phase delay plate.

Another aspect of the invention is an organic light emitting diode display, comprising: an organic light emitting diode configured to emit at least first circularly polarized light; a dual brightness enhancement film (DBEF) formed over the OLED and configured to input the first circularly polarized light and output first linearly polarized light; a first polarizing plate formed on the DBEF and configured to transmit the first linearly polarized light; a cholesteric liquid crystal (CLC) layer formed on the first polarizing plate and configured to input the first linearly polarized light and output second circularly polarized light; a first phase delay plate formed on the CLC layer and configured to input the second circularly polarized light and output second linearly polarized light; and a second polarizing plate formed on the first phase delay plate and configured to transmit the second linearly polarized light.

In the above display, the first phase delay plate is a ¼ wavelength plate. The above display further comprises a second phase delay plate disposed between the OLED and the DBEF. The above display further comprises an adhesive layer between the OLED and the second phase delay plate. The above display further comprises a first substrate; a driving circuit formed between the first substrate and the organic light emitting diode, wherein the driving circuit is configured to drive the organic light emitting diode; and a second substrate formed on the second polarizing plate and configured to display images based on the second linearly polarized light received from the second polarizing plate.

Another aspect of the invention is an organic light emitting diode display, comprising: a first polarizing plate configured to input external light and output first linearly polarized light; a first phase delay plate formed below the first polarizing plate and configured to input the first linearly polarized light and output first circularly polarized light; a cholesteric liquid crystal (CLC) layer formed below the first phase delay plate and configured to transmit the first circularly polarized light; a second polarizing plate formed below the CLC layer and configured to input the first circularly polarized light and output second linearly polarized light; a dual brightness enhancement film (DBEF) formed below the second polarizing plate and configured to transmit the second linearly polarized light; a second phase delay plate formed below the DBEF and configured to input the second linearly polarized light and output second circularly polarized light; and an organic light emitting diode configured to reflect at least part of the second circularly polarized light toward the second phase delay plate.

In the above display, both the first and second phase delay plates are a ¼ wavelength plate.

DETAILED DESCRIPTION OF CERTAIN INVENTIVE EMBODIMENTS

Figure 1:
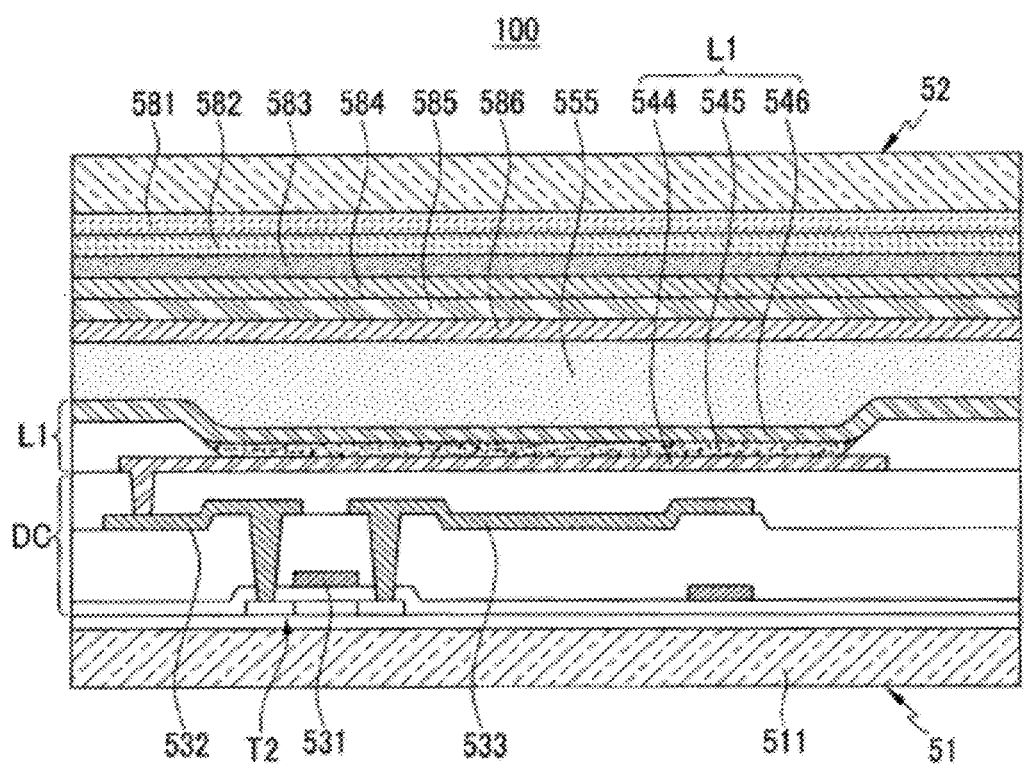
FIG. 1 is a partial cross-sectional view of an OLED display according to an exemplary embodiment of the present invention.

In general, at least one of the hole injection electrode and the electron injection electrode of an OLED display can reflect light generated from an organic light emission layer as well as from an external source. Therefore, the OLED display has problems in that expression of a black color and contrast can be deteriorated due to reflection of external light when the OLED display is used in a bright place.

In order to solve the problems, a polarizing plate and a phase delay plate are disposed for suppressing reflection of the external light. However, when the external light is suppressed by the polarizing plate and the phase delay plate, a large amount of light generated from the organic emission layer can also be lost.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In addition, the size and thickness of each configuration shown in the drawings are not limited thereto.

In order to describe embodiments of the present invention more clearly, parts that are not related to the description will be omitted from the drawings, and the same symbols will be given to similar parts throughout the specification.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In one embodiment, as shown in FIG. 1, an organic light emitting diode (OLED) display 100 includes a driving circuit unit DC, an OLED L1, a first phase delay plate 586, a dual brightness enhancement film (DBEF) 585, a first polarizing plate 584, a cholesteric liquid crystal (CLC) layer 583, a second phase delay plate 582, and a second polarizing plate 581.

The first phase delay plate 586, the DBEF 585, the first polarizing plate 584, the CLC layer 583, the second phase delay plate 582, and the second polarizing plate 581 are sequentially disposed on the OLED L1.

The driving circuit unit DC and the OLED L1 are generally formed on a first substrate 51. That is, the first substrate 51 includes a substrate member 511, the driving circuit unit DC formed on the substrate member 511, and the OLED L1 formed on the driving circuit unit DC.

Figure 2:
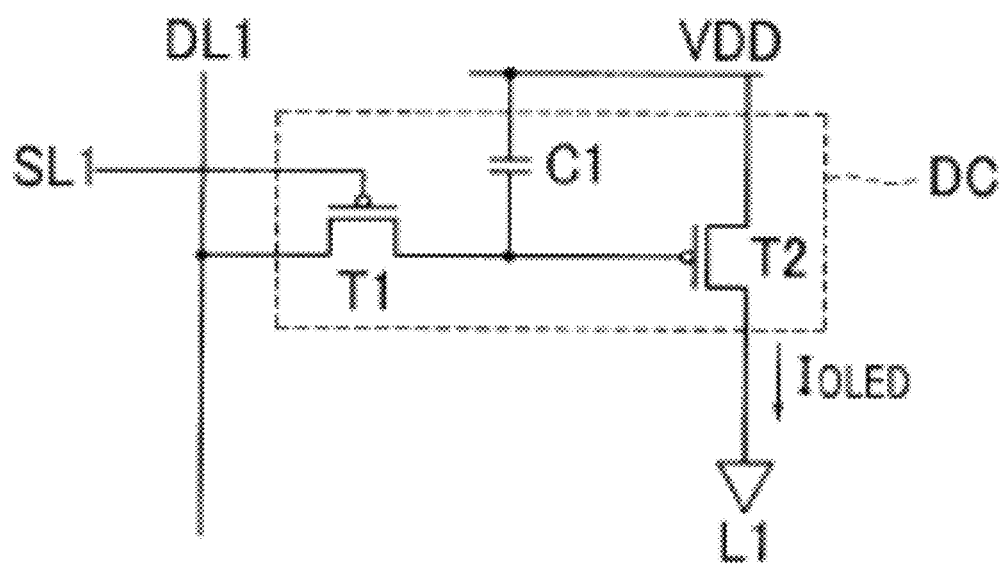
FIG. 2 is a layout view of a circuit layout of a driving circuit unit and an OLED of FIG. 1.

In one embodiment, the driving circuit unit DC has a layout structure as shown in FIG. 2. That is, as shown in FIG. 2, the driving circuit unit DC may include at least two thin film transistors T1 and T2 and at least one storage capacitor C1. Thin film transistors may include a switching transistor T1 and a driving transistor T2.

The switching transistor T1 is connected to a scan line SL1 and a data line DL1, and transmits a data voltage input from the data line DL1 according to a switching voltage input to the scan line SL1 to the driving transistor T2. The storage capacitor C1 is connected to the switching transistor T1 and a power source line VDD, and stores a voltage that corresponds to a difference between a voltage transmitted from the switching transistor T1 and a voltage supplied to the power source line VDD.

The driving transistor T2 is connected to the power source line VDD and the storage capacitor C1 and supplies an output current IOELD that is proportional to the square of a difference between the voltage stored in the storage capacitor C1 and a threshold voltage to the OLED L1, and the OLED L1 emits light by the output current IOELD.

Referring back to FIG. 1, the driving transistor T2 includes a source electrode 533, a drain electrode 532, and a gate electrode 531.

The OLED L1 includes a first electrode 544, an organic emission layer 545 formed on the first electrode 544, and a second electrode 546 formed on the organic emission layer 545. In one embodiment, the first electrode 544 becomes an anode and the second electrode 546 becomes a cathode.

The first electrode 544 of the OLED L1 is connected to the drain electrode 532 of the driving transistor T2.

The configuration of the driving circuit unit DC and the OLED L1 are not limited thereto, and may be variously modified with a disclosed configuration that can be realized by a person of ordinary skill in the art.

The first phase delay plate 586 and the second phase delay plate 582 change the phase of transmitted light. In one embodiment, the first phase delay plate 586 and the second phase delay plate 582 are formed as a ¼ wavelength plate, and circularly polarize linearly polarized light.

The first polarizing plate 584 and the second polarizing plate 581 linearly polarize the light. In one embodiment, the first polarizing plate 584 and the second polarizing plate 581 transmit light that matches a polarizing axis of each plate, and absorb light that does not match the polarizing axis. That is, light having passed through the first polarizing plate 584 and the second polarizing plate 581 are respectively linearly polarized toward a first polarizing axis direction of the first polarizing plate 584 and toward a second polarizing axis direction of the second polarizing plate 581. In addition, luminance is reduced by the amount of light lost by the first polarizing plate 584 and the second polarizing plate 581.

In one embodiment of the present invention, the first polarizing plate 584 has the first polarizing axis and the second polarizing plate 581 has the second polarizing axis that crosses the first polarizing axis.

The linearly polarized light formed while passing through first polarizing plate 584 is left circularly polarized (hereinafter referred to as left-circularly polarized light) while passing through the first phase delay plate 586 due to the alignment of the first polarizing plate 584 and the first phase delay plate 586.

On the contrary, when the left-circularly polarized is passed through the first phase delay plate 586, it is linearly polarized in substantially the same direction as the first polarizing axis of the first polarizing plate 584. That is, the left-circularly polarized light is linearly polarized after passing through the first phase delay plate 586, and this linearly polarized light can pass through the first polarizing plate 584.

However, when light that is circularly polarized to the right (hereinafter referred to as right-circularly polarized light) is passed through the first phase delay plate 586, it is linearly polarized in a direction that crosses the first polarizing axis of the first polarizing plate 584. This linearly polarized light cannot pass through the first polarizing plate 584.

In addition, linearly polarized light formed by passing through the second polarizing plate 581 is right-circularly polarized while passing through the second phase delay plate 582 due to the alignment of the second polarizing plate 581 and the second phase delay plate 582.

On the contrary, when the right-circularly polarized light is passed through the second phase delay plate 582, it is linearly polarized in substantially the same direction as the second polarizing axis of the second polarizing plate 581. This linearly polarized light can pass through the second polarizing plate 581.

However, left-circularly polarized light is linearly polarized in a direction that crosses the second polarizing axis of the second polarizing plate 581 when it is passed through the second phase delay plate 582. That is, the left-circularly polarized light is passed through the second phase delay plate 582 and is linearly polarized, and this linearly polarized light cannot pass through the second polarizing plate 581.

The DBEF 585 also transmits light that matches a polarizing axis, and reflects light that does not match the polarizing axis. The first and second polarizing plates 584 and 581 have a difference with the DBEF 585 in that the first and second polarizing plates 584 and 581 absorb light that does not match their polarizing axes.

In addition, the DBEF 585 is interposed between the first polarizing plate 584 and the first phase delay plate 586, and has a polarizing axis that is the same or substantially the same as the first polarizing axis of the first polarizing plate 584.

Accordingly, light that is linearly polarized through the DBEF 585 can pass through the first polarizing plate 584, and light that is linearly polarized through the first polarizing plate 584 can pass through the DBEF 585.

The CLC layer 583 is disposed between the second phase delay plate 582 and the first polarizing plate 584. In one embodiment, a light axis of the CLC layer 583 matches the first polarizing axis of the first polarizing plate 584 in an opposite direction of the first polarizing plate 584.

In one embodiment, the CLC has a layered structure like a smectic liquid crystal, but molecules of a longitudinal axis are arranged in parallel like a nematic liquid crystal. In one embodiment, thin and long molecules are arranged in substantially parallel in a longitudinal direction in one plane, and move to a direction that is substantially perpendicular to the corresponding surface so that the alignment direction of the molecule axis has a structure that is curved in a helical shape. Therefore, the entire liquid crystal layer may have a helical structure. The CLC may have characteristics such as optical rotary power, selective light scattering, circular polarization, and dichroism.

Therefore, the CLC layer 583 can selectively transmit or reflect circularly polarized light. In one embodiment, the CLC layer 583 absorbs right-circularly polarized light and reflects left-circularly polarized light. However, the present invention is not limited thereto. For example, the CLC layer 583 may transmit left-circularly polarized light and reflect right-circularly polarized light, or both sides of the CLC layer 583 may selectively transmit or reflect light in different ways.

In one embodiment, the CLC layer 583 transmits circularly polarized light in substantially the same direction as light that is circularly polarized by sequentially passing through the second polarizing plate 581 and the second phase delay plate 582, and reflects circularly polarized light in a different direction. Here, the light that is circularly polarized by sequentially passing through the second polarizing plate 581 and the second phase delay plate 582 is right-circularly polarized light.

In one embodiment, the light axis of the CLC layer 583 matches the first polarizing axis of the first polarizing plate 584. In this embodiment, most of the linearly polarized light formed through the first polarizing plate 584 is passed through the CLC layer 583 and changed to right-circularly polarized light. The right-circularly polarized light may be linearly polarized in a direction that matches the polarizing axis of the second polarizing plate 581 while passing through the second phase delay plate 582 so that it can be passed through the second polarizing plate 581.

Resultantly, light that is passed through the first polarizing plate 584 can pass through the second polarizing plate 581 with minimal loss while passing through the CLC layer 583 and the second phase delay plate 582.

A second substrate 52 covers the first substrate 51 where the OLED L1 and the driving circuit unit DC are formed. In addition, the second substrate 52 covers the first phase delay plate 586, the DBEF 585, the first polarizing plate 584, the CLC layer 583, the second phase delay plate 582, and the second polarizing plate 581 that are sequentially formed on the OLED L1. However, the present invention is not limited thereto. Therefore, the first phase delay plate 586, the DBEF 585, the first polarizing plate 584, the CLC layer 583, the second phase delay plate 582, and the second polarizing plate 581 may be formed on the second substrate 52.

In addition, the OLED display 100 may further include an adhesive layer 555 interposed between the second electrode 546 and the first phase delay plate 586 of the organic light emitting element L1.

With this configuration, the OLED display 100 can effectively suppress external light reflection and minimize light loss when light generated from the organic emission layer (545 of FIG. 1) is emitted to the outside.

In addition, the OLED display 100 can improve black color expression and contrast. That is, display characteristics of the OLED display 100 can be improved.

Further, the OLED display 100 can have reduced power consumption and an increased life-span.

Figure 3:
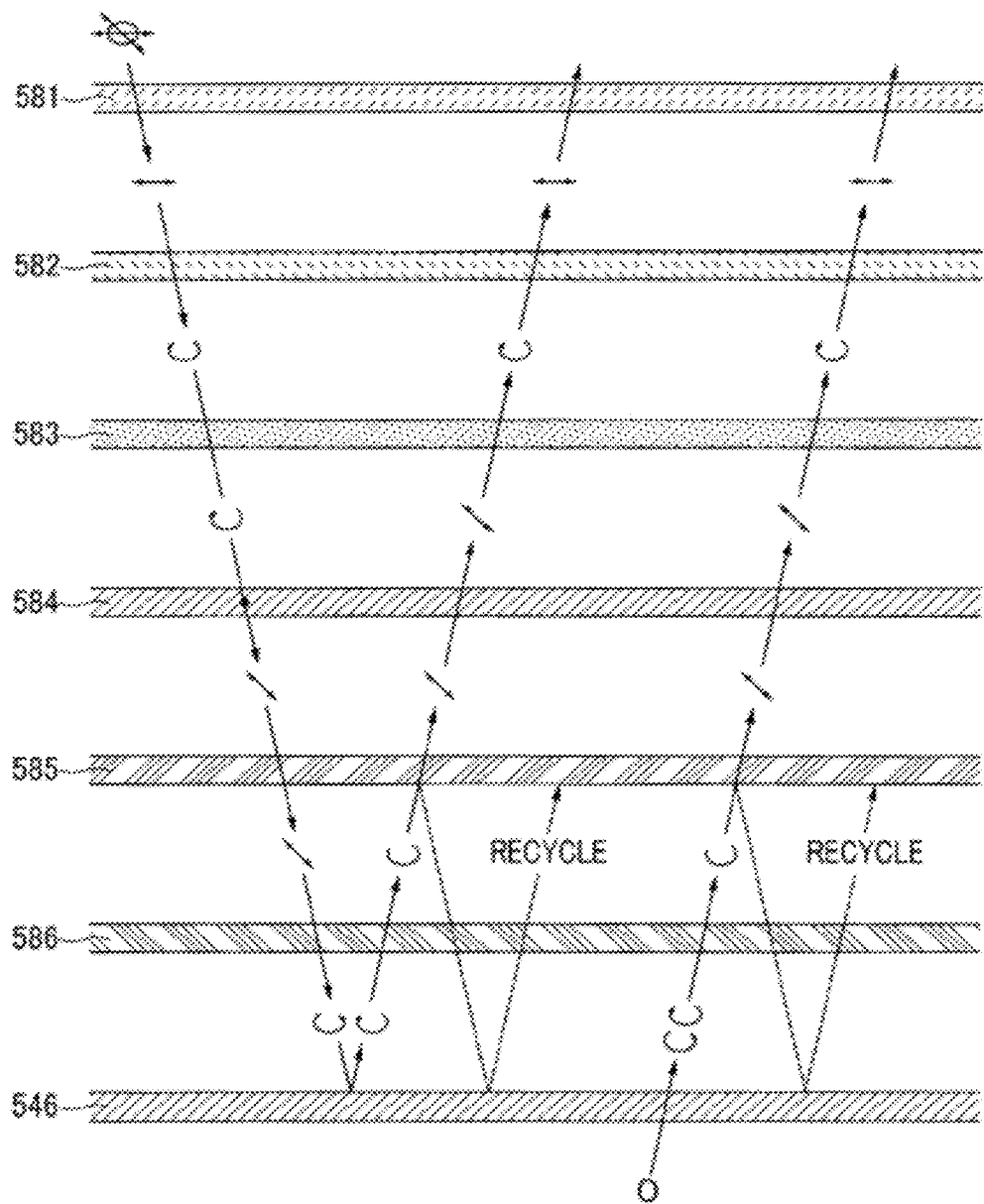
FIG. 3 is a cross-sectional view of a path of light transmitted into the OLED display and a path for emission of light generated from the OLED of FIG. 1.

Hereinafter, external light suppression in the OLED display 100 will be described with reference to FIG. 3.

First, the external light passes through the second polarizing plate 581 and becomes linearly polarized in a direction of the second polarizing axis (hereinafter referred to as a second direction) of the second polarizing plate 581. This linearly polarized light passes through the second phase delay plate 582 and becomes right-circularly polarized light so that it passes through the CLC layer 583.

The right-circularly polarized light having passed through the CLC layer 583 passes through the first polarizing plate 584 again and becomes linearly polarized in a direction of the first polarizing axis (hereinafter referred to as a first direction) of the first polarizing plate 584. Through this process, a large amount of light is lost. This is because, among the right-circularly polarized light provided to the first polarizing plate 584, light of which a direction matches the first polarizing axis of the first polarizing plate 584 is passed through the first polarizing plate 584 and light of a different direction is absorbed by the first polarizing plate 584.

Therefore, the OLED display 100 can suppress reflection of external light by eliminating a significant amount of external light with the first polarizing plate 584.

The linearly polarized light having passed through the first polarizing plate 584 sequentially passes through the DBEF 585 and the first phase delay plate 586 and becomes left-circularly polarized light. When the left-circularly polarized light is reflected to the second electrode (546 of FIG. 1) or the first electrode (544 of FIG. 1) of the organic light emitting element (L1 of FIG. 1), the phase of the left-circularly polarized light is twisted by 180 degrees (or about 180 degrees) so that it is changed to right-circularly polarized light and moves to the first phase delay plate 586 again.

The right-circularly polarized light passes through the first phase delay plate 586 and the phase of the right-circularly polarized light is twisted. That is, light having passed through the first phase delay plate 586 has mixed direction components. While passing the DBEF 585, a part of this light becomes linearly polarized and the rest of the light is reflected and moves to the first phase delay plate 586 again.

As described, light circulates between the DBEF 585 and second electrode 546 and the first electrode 544 of the organic light emitting element L1, and a part of the light is passed through the DBEF 585 and becomes linearly polarized and the rest of the light is reflected again. In one embodiment, this process is iteratively performed. The first phase delay plate 586 changes the phase of the circulating light so that the DBEF 585 can continuously linearly polarize a part of the circulating light. Therefore, light that is initially reflected by the DBEF 585 eventually passes the DBEF 585 and becomes linearly polarized.

The linearly polarized light having passed through the DBEF 585 passes through the first polarizing plate 584 and the CLC layer 583 and becomes right-circularly polarized light. This is because a light axis of the CLC layer 583 matches the polarizing axis of the first polarizing plate 584, and the CLC layer 583 only transmits right-circularly polarized light. The right-circularly polarized light formed by passing through the CLC layer 583 passes the second phase delay plate 582 again and becomes linearly polarized in the second direction, and then is passed through the second polarizing plate 581 and emitted outside.

As described, the OLED display 100 eliminates a large amount of external light through the first and second polarizing plates disposed crossing each other so that a part of the external light is reflected and emitted outside.

Therefore, the OLED display 100 can effectively suppress external light reflection.

A process in which light generated from the OLED L1 is emitted outside is the same as the above-described process in which the external light is reflected by the second electrode 546 or the first electrode of the OLED L1 and emitted outside.

Therefore, the organic emission layer 545 can minimize light loss in the process of emitting light generated from the organic emission layer 545 to the outside.

Although the first polarizing plate 584 and the DBEF 585 disposed in substantially parallel with each other change light that passes therethrough to linearly polarized light with the same polarizing axis, they have different functions. That is, the first polarizing plate 584 may eliminate external light, and the DBEF 585 may help light generated from the OLED L1 to be emitted outside by transmitting the light without any loss.

In addition, one embodiment of the present invention includes the first phase delay plate 586, but this is not restrictive. For example, the first phase delay plate 586 may be omitted. When light is recycled between the DBEF 585 and the electrodes 544 and 546 of the OLED L1, the first phase delay plate 586 changes the phase of the light so that the light can efficiently pass through the DBEF 585. However, the light can be recycled between the DBEF 585 and the electrodes 544 and 546 of the OLED L1 without the first phase delay plate 586.

According to at least one embodiment, the OLED display can minimize loss of light generated from the organic emission layer while suppressing reflection of external light.

In addition, the OLED display can improve black color expression and contrast. That is, display characteristics of the OLED display can be improved. In addition, the OLED display can reduce power consumption and improve life-span.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   an OLED comprising i) a first electrode, ii) an organic emission layer formed on the first electrode, and iii) a second electrode formed on the organic emission layer;
   a dual brightness enhancement film (DBEF) formed over the second electrode of the OLED;
   a first polarizing plate directly contacting the DBEF;
   a cholesteric liquid crystal (CLC) layer directly contacting the first polarizing plate, wherein the first polarizing plate is interposed between and contacts the CLC layer and the DBEF;
   a phase delay plate formed on the CLC layer, wherein the phase delay plate is a ¼ wavelength plate; and
   a second polarizing plate formed on the phase delay plate.

2. The OLED display of claim 1, wherein a polarizing axis of the first polarizing plate and a polarizing axis of the second polarizing plate cross each other.

3. The OLED display of claim 2, wherein the polarizing axis of the first polarizing plate and a polarizing axis of the DBEF are the same.

4. The OLED display of claim 1, wherein the CLC layer is configured to transmit one of right-circularly polarized light and left-circularly polarized light and reflect the other light.

5. The OLED display of claim 1, wherein the phase delay plate is configured to receive first linearly polarized light from the second polarizing plate and output first circularly polarized light toward the CLC layer.

6. The OLED display of claim 5, wherein the CLC layer is configured to transmit the first circularly polarized light toward the first polarizing plate.

7. The OLED display of claim 6, wherein the first polarizing plate is configured to i) transmit a portion of the first circularly polarized light which matches a polarizing axis of the first polarizing plate and ii) absorb a portion of the first circularly polarized light which does not match the polarizing axis of the first polarizing plate.

8. The OLED display of claim 7, wherein the DBEF is configured to receive and transmit, the portion of the first circularly polarized light which matches a polarizing axis of the first polarizing plate, toward the OLED.

9. The OLED display of claim 1, wherein the CLC layer is configured to receive second linearly polarized light from the first polarizing plate and output second circularly polarized light toward the phase delay plate.

10. The OLED display of claim 1, wherein a polarizing axis of the first polarizing plate and a light axis of the CLC layer are the same.

11. The OLED display of claim 1, further comprising an additional phase delay plate disposed between the OLED and the DBEF.

12. The OLED display of claim 11, wherein the additional phase delay plate is a ¼ wavelength plate, and wherein the additional phase plate is configured to change linearly polarizing light received from the DBEF to circularly polarized light.

13. The OLED display of claim 12, further comprising an adhesive layer between the OLED and the additional phase delay plate.

14. An organic light emitting diode display, comprising:
    an organic light emitting diode configured to emit at least first circularly polarized light;
    a dual brightness enhancement film (DBEF) formed over the OLED and configured to input the first circularly polarized light and output first linearly polarized light;
    a first polarizing plate directly contacting the DBEF and configured to transmit the first linearly polarized light;
    a cholesteric liquid crystal (CLC) layer directly contacting the first polarizing plate and configured to input the first linearly polarized light and output second circularly polarized light wherein the first polarizing plate is interposed between and contacts the CLC layer and the DBEF;
    a first phase delay plate formed on the CLC layer and configured to input the second circularly polarized light and output second linearly polarized light; and
    a second polarizing plate formed on the first phase delay plate and configured to transmit the second linearly polarized light.

15. The OLED display of claim 14, wherein the first phase delay plate is a ¼ wavelength plate.

16. The OLED display of claim 14, further comprising a second phase delay plate disposed between the OLED and the DBEF.

17. The OLED display of claim 16, further comprising an adhesive layer between the OLED and the second phase delay plate.

18. The organic light emitting diode display of claim 14, further comprising:
    a first substrate;
    a driving circuit formed between the first substrate and the organic light emitting diode, wherein the driving circuit is configured to drive the organic light emitting diode; and
    a second substrate formed on the second polarizing plate and configured to display images based on the second linearly polarized light received from the second polarizing plate.

19. An organic light emitting diode display, comprising:
    a first polarizing plate configured to input external light and output first linearly polarized light;
    a first phase delay plate formed below the first polarizing plate and configured to input the first linearly polarized light and output first circularly polarized light;
    a cholesteric liquid crystal (CLC) layer formed below the first phase delay plate and configured to transmit the first circularly polarized light;
    a second polarizing plate formed below and directly contacting the CLC layer and configured to input the first circularly polarized light and output second linearly polarized light;
    a dual brightness enhancement film (DBEF) formed below and directly contacting the second polarizing plate and configured to transmit the second linearly polarized light;
    a second phase delay plate formed below the DBEF and configured to input the second linearly polarized light and output second circularly polarized light; and
    an organic light emitting diode configured to reflect at least part of the second circularly polarized light toward the second phase delay plate.

20. The OLED display of claim 19, wherein both the first and second phase delay plates are a ¼ wavelength plate.

* * * * *